(12) United States Patent
Matsuno et al.

(10) Patent No.: US 6,874,516 B2
(45) Date of Patent: Apr. 5, 2005

(54) SUBSTRATE CLEANING APPARATUS

(75) Inventors: Kousaku Matsuno, Okayama (JP); Masao Iga, Okayama (JP); Takeji Ueda, Okayama (JP); Jun Kanayasu, Okayama (JP); Satoshi Shikami, Okayama (JP)

(73) Assignee: m·FSI Ltd., Tokyo (JP)

( * ) Notice: Subject to any disclaimer, the term of this patent is extended or adjusted under 35 U.S.C. 154(b) by 336 days.

(21) Appl. No.: 10/157,155

(22) Filed: May 30, 2002

(65) Prior Publication Data
US 2003/0005948 A1 Jan. 9, 2003

(30) Foreign Application Priority Data
May 31, 2001 (JP) ....................... 2001-165644

(51) Int. Cl.$^7$ ................................ B08B 3/02
(52) U.S. Cl. .................. 134/148; 134/157; 134/199; 134/902
(58) Field of Search ................. 134/200, 148, 134/157, 902, 104.1, 199

(56) References Cited

U.S. PATENT DOCUMENTS

| | | | | |
|---|---|---|---|---|
| 3,375,834 A | * | 4/1968 | Best et al. ................. 134/94.1 |
| 4,827,867 A | * | 5/1989 | Takei et al. .................... 118/64 |
| 5,512,106 A | * | 4/1996 | Tamai et al. ..................... 134/7 |
| 5,591,262 A | * | 1/1997 | Sago et al. .................... 118/52 |
| 5,678,116 A | * | 10/1997 | Sugimoto et al. ............ 396/611 |
| 5,815,762 A | * | 9/1998 | Sakai et al. .................. 396/611 |
| 5,845,662 A | * | 12/1998 | Sumnitsch ................... 134/153 |
| 5,868,865 A | * | 2/1999 | Akimoto ....................... 134/33 |
| 5,927,303 A | * | 7/1999 | Miya et al. .................. 134/148 |
| 5,975,097 A | * | 11/1999 | Yonemizu et al. ......... 134/95.2 |
| 6,159,288 A | * | 12/2000 | Satou et al. ................... 118/70 |
| 6,350,319 B1 | * | 2/2002 | Curtis et al. ................ 118/715 |
| 6,536,452 B1 | * | 3/2003 | Kohama et al. ............ 134/117 |
| 6,589,361 B2 | * | 7/2003 | Luscher et al. ............... 134/33 |
| 6,594,847 B1 | * | 7/2003 | Krusell et al. ................ 15/102 |
| 6,725,868 B2 | * | 4/2004 | Kamikawa et al. ........ 134/99.1 |

FOREIGN PATENT DOCUMENTS

| | | |
|---|---|---|
| JP | 1-261829 | * 10/1989 |
| JP | 9-298136 | * 11/1997 |
| JP | 10-242111 | * 9/1998 |

* cited by examiner

Primary Examiner—Frankie L. Stinson
(74) Attorney, Agent, or Firm—Oblon, Spivak, McClelland, Maier & Neustadt, P.C.

(57) ABSTRACT

A substrate cleaning apparatus comprises an outer shell constructed such that the outer shell is selectively openable or hermetically closable to form a sealed space, an inner shell enclosed within the outer shell and having a holding member for holding a substrate, and a dispenser unit for feeding at least one of gas and liquid into the inner shell. Within the sealed space formed by the outer shell, a highly gas-tight space is formed by the inner shell to permit cleaning of the substrate within the highly gas-tight space. Also disclosed are a dispenser, a substrate holding mechanism and a substrate cleaning chamber, which are suitable for use with the substrate cleaning apparatus, and substrate cleaning processes making use of these dispenser, substrate holding mechanism and substrate cleaning chamber, respectively.

7 Claims, 15 Drawing Sheets

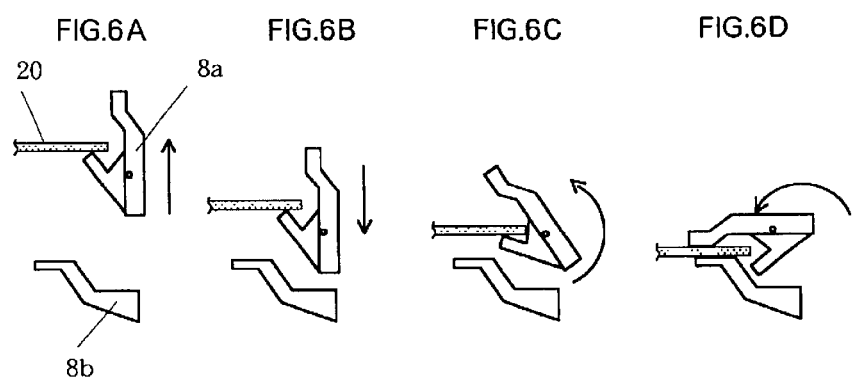
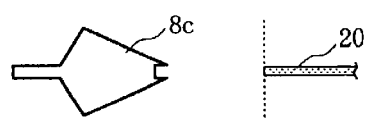
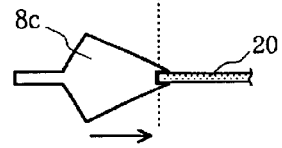

SUBSTRATE CLEANING APPARATUS

BACKGROUND OF THE INVENTION

Field of the Invention

This invention relates to an apparatus (hereinafter called "a substrate cleaning apparatus") useful in cleaning, for example, a semiconductor substrate material such as a silicon wafer (hereinafter called "a substrate"). This invention is also concerned with a dispenser, a substrate holding mechanism and a substrate cleaning chamber, which are suitable for use with the substrate cleaning apparatus. This invention also pertains to substrate cleaning processes making use of the dispenser, substrate holding mechanism and/or substrate cleaning chamber.

Keeping in step with abrupt developments of the semiconductor industry, requirements for semiconductor substrate materials such as silicon wafers are becoming stricter year by year, resulting in an outstanding desire for the development of a substrate cleaning apparatus and process capable of completely performing cleaning-off of unwanted substances, such as mist, from a surface of a substrate and/or treatment for the removal of undesired parts from a surface of a substrate (hereinafter simply called "cleaning"). In these days, cleaning of a substrate is not limited to its front side but cleaning of its back side is also desired. Conventional substrate cleaning apparatuses, however, can hardly perform high-accuracy cleaning, because in most of such conventional apparatuses, a closed section (hereinafter called "a chamber") in which cleaning is performed is not completely divided into a substrate cleaning section and its peripheral section but includes these sections in a structurally undivided form. There are some conventional substrate cleaning apparatuses with internally divided chambers. The division of each of such chambers is, however, limited to such an extent as arrangement of a partition wall, which exhibits shielding or straightening effect, for the purpose of preventing mist from mixing in a chemical or rise water to be provided for the cleaning of a substrate.

It is also known to divide a chamber of a substrate cleaning apparatus into two sections, one being a section for conducting cleaning with a chemical or the like and the other a section for rinsing the chemical or the like, and to conduct both cleaning and rinsing in situ, in other words, in the same chamber. This is to divide the interior of the same chamber into different sections depending on the types of treatments, and is not to isolate a section, in which cleaning is conducted, from its peripheral section and vice versa.

In conventional substrate cleaning apparatuses, the vacuum chuck system that a substrate to be cleaned is held at its back side under a vacuum is widely employed as a means for holding the substrate. This system is excellent in that, as long as control of a vacuum does not cease, the substrate can be held stably even when the substrate is spun at high rpm. Under the current situation that cleaning is also required for the back side of a substrate, the above-described system is improper because a holder remains in direct contact with the back side of the substrate.

As a system involving no contact between a holder and the back side of a substrate, on the other hand, a non-contact substrate holding system making use of the Bernoulli effect has been proposed. Compared with the conventional system that a holder remains in direct contact with a substrate, this system is superior from the viewpoint of avoiding contamination by a mechanical cause, and has possibility of finding wide-spread utility. However, this system generally uses a gaseous fluid so that a high degree of control is required on the gaseous fluid. This system is effective as a chuck mechanism for holding a substrate. From the viewpoint of surface cleaning, however, this system cannot treat both sides of a substrate at the same time because only one side is exposed to gas which is continuously fed.

In each of the conventional substrate cleaning apparatuses, the interior of the chamber is exposed to a treatment chemical and a rinse solution. Most of the conventional substrate cleaning apparatus are, however, not equipped with any means for positively washing inner walls of their chambers. Proposed means are limited to those for washing a periphery of a treatment section with water. It is, however, difficult to wash the interior of a chamber with water in the course of a series of cleaning of substrates. The above-proposed means, therefore, require frequent allocations of time exclusively for washing the chamber.

In cleaning a substrate, it is a common practice to exclusively clean only a part of the substrate, for example, its front side, its back side or a bevel (a swell of copper formed on an outer periphery of the substrate upon plating). The above-described exclusive cleaning of only a part of a substrate is excellent from the viewpoint of high-accuracy cleaning, but at a fabrication site, requires purchase of different apparatuses for different parts, resulting in the need for higher cost and broader installation space. Even when cleaning a substrate at the entire surfaces thereof, its surfaces may be exclusively cleaned part by part in some instances. This is attributed to actual circumstances that cleaning must unavoidably be performed exclusively part by part because except for complete dipping of a substrate in a chemical or the like, a substrate is often spun in such equipment as treating substrates one by one as in single wafer treatment and a limitation is hence imposed on the cleaning by a mechanism for holding the substrate.

SUMMARY OF THE INVENTION

An object of the present invention is, therefore, to provide a substrate cleaning apparatus and process capable of performing high-accuracy cleaning to completely remove unwanted substances, such as mist, and/or undesired parts from a surface of a substrate and also various units suitable for use in the apparatus and process.

Another object of the present invention is to provide a substrate cleaning apparatus capable of minimizing contamination of a substrate by a substrate holding member and also capable of applying high-accuracy cleaning to both front and back sides of the substrate, a peripheral edge face (which may hereinafter be called simply "the edge") of the substrate and also one or more desired parts of the substrate in the same chamber in single wafer treatment; a dispenser, a substrate holding mechanism and a substrate cleaning chamber, all of which are suitable for use in the substrate cleaning apparatus; and also substrate cleaning processes making use of these dispenser, holding mechanism and/or chamber, respectively.

A further object of the present invention is to provide a substrate cleaning apparatus which can also be used in the cleaning of a substrate with dangerous gas or high-concentration gas and can perform high-accuracy and high-safety cleaning such that waste water and mist are surely discharged without occurrence of recontamination after the cleaning; a substrate holding mechanism and a substrate cleaning chamber, both of which are suitable for use in the substrate cleaning apparatus; and also substrate cleaning processes making use of these holding mechanism and/or chamber, respectively.

The above-described objects can be achieved by the present invention to be described hereinafter. Described specifically, the present invention, in one aspect thereof, provides a substrate cleaning apparatus comprising: an outer shell constructed such that the outer shell is selectively openable or hermetically closable to form a sealed space, an inner shell enclosed within the outer shell and having a holding member for holding a substrate, and a dispenser unit for feeding at least one of gas and liquid into the inner shell, wherein within the sealed space formed by the outer shell, a highly gas-tight space is formed by the inner shell to permit cleaning of the substrate within the highly gas-tight space. In another aspect of the present invention, there is also provided a substrate cleaning apparatus comprising: an outer shell constructed such that the outer shell is selectively openable or hermetically closable, an inner shell enclosed within the outer shell and having an upper and lower openings and an outlet for discharging effluent, and an upper and lower dispenser units arranged for vertical movements such that the upper and lower dispenser units can be inserted into or removed from the upper and lower openings, respectively, said dispenser units being provided on inner end portions thereof with flat areas each of which has at least one nozzle, and, when the upper and lower dispenser units are inserted into the upper and lower openings of the inner shell, respectively, a highly gas-tight space is formed by the inner end portions and an inner wall of the inner shell, wherein the inner shell is provided through the inner wall thereof with an outlet for discharging at least one of waste gas and waste liquid and is also provided on the inner wall thereof with a holding member for holding a substrate (hereinafter simply called the "substrate"), which is under cleaning, out of contact with the end portions of the dispenser units, and the inner shell is constructed for rotation about a vertical axis thereof with the substrate held by the holding member.

Each of the substrate cleaning apparatus according to the present invention has a double shell structure that a treatment space is isolated from a peripheral section, thereby making it possible to minimize the contact between a substrate under cleaning and an external atmosphere. As a result, safe and high-accuracy cleaning is feasible. Described specifically, the above-described possession of the double shell structure makes it possible to safely perform desired cleaning because, even when a gas or chemical harmful to the human body is used in the treatment space, the double shell structure does not permit leakage of the harmful gas or chemical into the external atmosphere. Further, the possession of the double shell structure also realizes a very high level of sealing in the treatment space, enables easy control of physical quantities such as pressure, temperature and humidity in the treatment space in accordance with desired treatment conditions, and therefore, permits high-accuracy cleaning. In addition, provision of an optional space between the treatment space and the peripheral section to enhance the sealing of the peripheral section allows the peripheral section to play a role as a buffer for minimizing effects from the external environment on the treatment space. In this respect too, high-accuracy cleaning of a substrate is feasible.

A need for various chemicals and gases in the cleaning of a substrate unavoidably results in a large substrate cleaning apparatus. The substrate cleaning apparatuses make it possible to simplify a system for feeding a chemical, so that the substrate cleaning apparatuses are each expected to be constructed in a smaller size.

In a further aspect of the present invention, there is also provided a dispenser useful in cleaning a substrate, comprising: a pair of upper and lower members provided at inner end portions with flat areas capable of extending over at least parts of front and back sides of a substrate, respectively, a vertical movement control mechanism for fixing the flat areas substantially in parallel with the substrate, with desired clearances between the front and back sides of the substrate and the corresponding ones of the flat areas, without any contact between the front and back sides of the substrate and the corresponding flat areas, and at least one nozzle arranged at one of the flat areas and at least one nozzle arranged at the other flat area such that at least one of gas and liquid can be fed to the front and back sides of the substrate. In a still further aspect of the present invention, there is also provided a process for cleaning a substrate by the dispenser, which comprises the following step: maintaining the clearances between the front and back sides of the substrate and the corresponding ones of the flat areas at a value not greater than 3 mm and feeding the liquid through from the nozzles such that films of the liquid are formed between the front and back sides of the substrate and the corresponding flat areas.

The dispenser according to the present invention comprises the pair of upper and lower members provided at the inner end portions thereof with the flat areas capable of extending over at least parts of the front and back sides of the substrate, respectively, and has the vertical movement control mechanism for fixing the flat areas substantially in parallel with the substrate, with desired clearances between the front and back sides of the substrate and the corresponding ones of the flat areas, without any contact between the front and back sides of the substrate and the corresponding flat areas. It is, therefore, possible to form films of liquid between the substrate and the flat areas by making use of a surface tension of the liquid and to perform cleaning while retaining these liquid films. Desired parts of the surfaces of the substrate can be subjected to cleaning while protecting the desired parts with the liquid films. Surface areas of the substrate, which are to be subjected to cleaning, can be determined as desired by choosing the number and position (s) of nozzle(s) to be arranged at each of the flat areas for feeding liquid or gas to the substrate. The conventional substrate cleaning apparatuses each requires arrangement of devices, units or the like for exclusively cleaning specific parts of a substrate, respectively. Owing to the use of the dispenser constructed as described above, however, the present invention has made it possible to apply cleaning to one or both of the sides of the substrate as desired in the same treatment space. Moreover, the formation of the liquid films can be achieved with a least amount of the liquid, so that the present invention is also excellent in economy.

Further, the use of the dispenser according to the present invention can also cause a liquid to pass between the substrate and the flat areas while retaining gas bubbles there by arranging the substrate and the flat areas close to each other, forming films of the liquid between the substrate and the flat areas, respectively, and then feeding gas into the liquid films. This treatment makes it possible to bring a small amount of reactive gas into contact with the substrate without diluting of the reactive gas and moreover, to allow boundaries of gas bubbles to run on and along the substrate. Cleaning effect such as physical separation of contaminants can also be expected, thereby making it possible to economically perform high-accuracy cleaning of the substrate.

By ingeniously determining the position(s), number and orifice size of nozzle(s) to be arranged at each of the flat areas, the dispenser according to the present invention can perform cleaning by feeding liquid to desired position or positions and therefore, can achieve uniform cleaning.

In a still further aspect of the present invention, there is also provided a substrate cleaning chamber capable of forming a highly gas-tight space for use in cleaning a substrate, comprising: plural holding members for holding the substrate in a horizontal plane, at least one nozzle for feeding at least one of gas and liquid to at least one of a front and back sides of the substrate arranged by the holding members, an outlet arranged at a position lower than the horizontal plane, in which the substrate is held, such that the at least one of the gas and liquid can be discharged, and a mechanism for rotating the substrate cleaning chamber about a vertical axis thereof with the substrate held therein. According to a still further aspect of the present invention, there is provided a process for cleaning a substrate by the substrate cleaning chamber, which comprises, while rotating the substrate cleaning chamber about the vertical axis thereof with the substrate held therein, feeding at least one of gas and liquid to at least one of a front and back sides of the substrate from at least one nozzle such that the at least one of the front and back sides of the substrate is subjected to at least one of washing and rinsing.

Conventional substrate cleaning apparatuses are observed to involve a problem that parts of a substrate, where the substrate is in direct contact with a holding member, are abraded to result in a considerable damage on the substrate itself. As the substrate cleaning chamber according to the present invention has the mechanism for rotating the substrate cleaning chamber about the vertical axis thereof with the substrate held therein, the above-mentioned problem can be lessened to increase the efficiency of cleaning.

According to the substrate cleaning chamber of the present invention, unwanted substances, such as liquid and mist, spread around by centrifugal force or a flow of liquid can be adequately and promptly discharged through the outlet. Preferably, the outlet may be constructed such that such unwanted substances can be promptly discharged out of the treatment space by using the kinetic energy of the liquid so spread out. This can effectively avoid the problem that a chemical employed for the cleaning of the substrate may remain in the treatment space and causes recontamination of the substrate, and therefore, can achieve high-accuracy cleaning. In a more preferred embodiment, plural discharge outlets may be arranged at positions lower than the horizontal plane in which the substrate is disposed. These discharge outlets allow liquid and gas, which have been employed for cleaning, to smoothly flow out in their entirety. As a result, it is possible to effectively prevent a chemical, rinse water or mist from flowing back to the side of the substrate. Because cleaning can be performed as described above, no special means is needed for washing or drying the interior of the treatment space. As the interior of the treatment space can be washed or dried concurrently with cleaning, the substrate cleaning chamber according to the present invention permits economical cleaning.

In a yet further aspect of the present invention, there is provided a substrate holding mechanism useful in cleaning a substrate, comprising: plural clamps each of which has an upper and lower members for holding a peripheral edge portion of the substrate at an upper and lower sides thereof such that the substrate is maintained in a substantially horizontal plane, and a control mechanism for operating the upper and lower members such that the upper and lower members repeat holding and release of the substrate in a successive order. Preferably, six clamps as defined above may be arranged at equal angular intervals therebetween at such locations that the peripheral edge portion of the substrate is held at the upper and lower sides thereof by the clamps arranged as three pairs of diametrically opposite clamps, and the three pairs of diametrically opposite clamps may each independently be operable in a pair by the control mechanism such that the three pairs of diametrically opposite clamps can repeatedly hold and release the substrate in a successive order. According to the substrate holding mechanism of the present invention, the peripheral edge portion of the substrate can be held at plural points, and moreover, the upper and lower members which are brought into contact with the substrate can hold and release the substrate in a successive order. It is, therefore, possible to completely clean the substrate over the entire surfaces thereof. By ingeniously designing the substrate holding mechanism such that the substrate is held at minimized areas, the substrate holding mechanism can stably hold the substrate without bringing a holder into the entire back side as in conventional substrate cleaning apparatuses, and accordingly, can minimize the contamination by contact with such a holder. In addition, the substrate holding mechanism according to the present invention makes it possible to clean the both sides of a substrate and its edge at the same time in the same treatment space. It is, therefore, no longer needed to arrange plural devices or units for exclusively cleaning specific areas, thereby permitting economical cleaning.

BRIEF DESCRIPTION OF THE DRAWINGS

FIGS. 6A through 6D and FIGS. 6a and 6b schematically illustrate the operation of a holding member applicable to the inner shell of the substrate cleaning apparatus according to the present invention;

DETAILED DESCRIPTION OF THE INVENTION AND PREFERRED EMBODIMENTS

The above-described various excellent advantageous effects can be obtained all together provided that the above-described apparatus of the double shell structure, which is composed of the outer shell and the inner shell and defines a doubly-sealed space in the inner shell, is used as a basis, the above-described substrate cleaning chamber with a highly gas-tight space formed for cleaning a substrate therein is used in the inner shell, the above-described dispensers are used as the dispenser units to feed gas and liquid and further, the above-described substrate holding mechanism is used as a holding member for holding the substrate within the chamber. The substrate cleaning apparatus according to the present invention, which has the above-described construction, will hereinafter be described with reference to the drawings.

Figure 1:
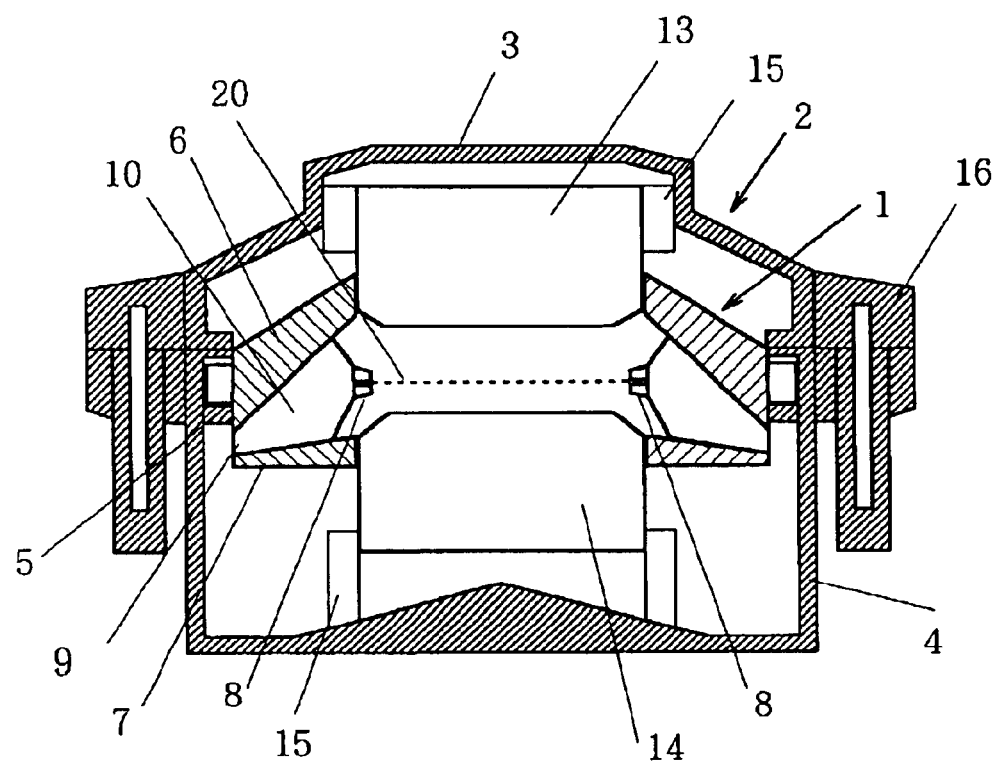
FIG. 1 is a cross-sectional view showing principal parts of a substrate cleaning apparatus according to the present invention.
Figure 2:
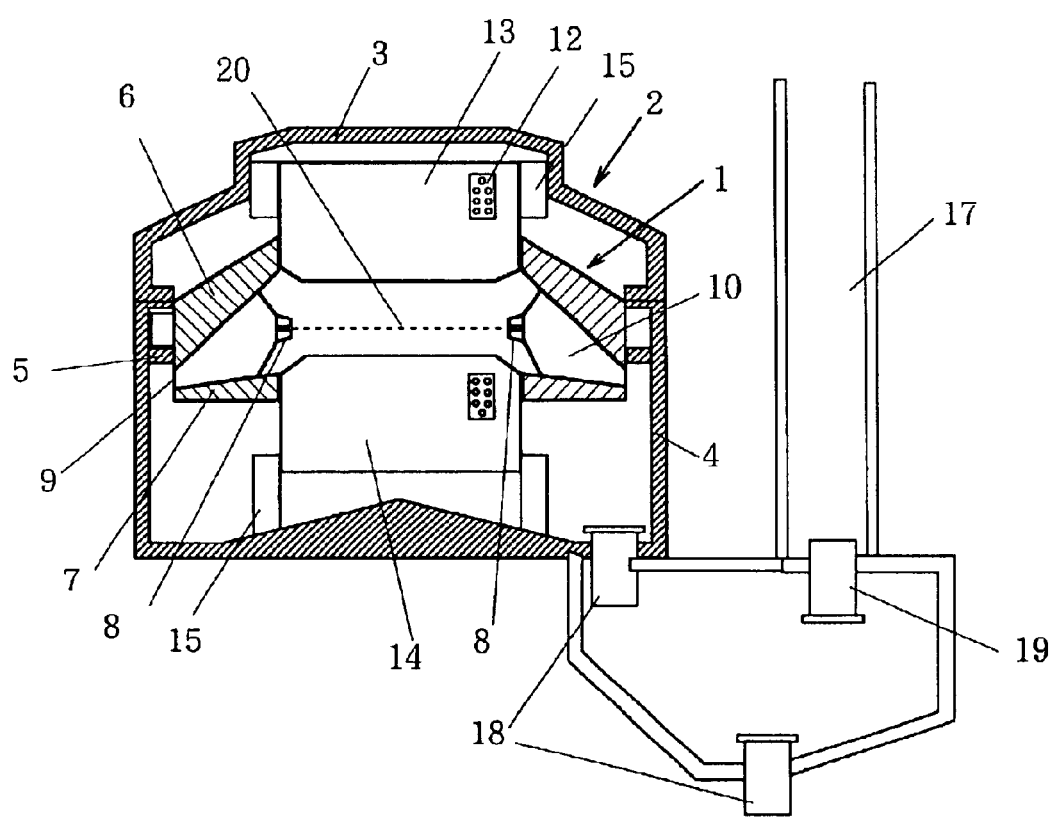
FIG. 2 is a cross-sectional view showing the principal parts of the substrate cleaning apparatus according to the present invention as taken at an angle different from FIG. 1.

FIGS. 1 through 4 illustrate the principal parts of the substrate cleaning apparatus according to the present invention (hereinafter called "the apparatus of the present invention") in which the above-described construction have been specifically embodied. As shown in FIG. 1 and FIG. 2, the apparatus of this invention comprises an outer shell 2 constructed such that the outer shell is selectively openable or hermetically closable to form a sealed space, an inner shell 1 enclosed within the outer shell 2 and provided with openings in at least upper and lower portions thereof, respectively, and a pair of upper and lower dispenser units 13,14 arranged for vertical movements such that the upper and lower dispenser units can be inserted into or removed from the upper and lower openings of the inner shell 1, respectively. By inner end portions of these dispenser units 13, 14 and an inner wall of the inner shell 1, a highly gas-tight space (hereinafter called "the treatment space") is formed. These outer shell 2, inner shell 1 and dispenser units 13, 14 are arranged such that, when a substrate 20 is arranged in the treatment space, the substrate is held with its front and back sides kept out of contact with the lower and upper end portions of the dispenser units 13,14 to permit efficient cleaning of the substrate. Further, the inner shell 1 is constructed such that the inner shell 1 is rotatable about a vertical axis thereof while holding the substrate 20. The dispenser units 13,14 are provided on peripheral end portions thereof with supply ports 12 for feeding a chemical and/or a gas into the space. Upon using the above-described apparatus, the inner shell 1 is rotated about the vertical axis thereof while holding the substrate 20 in such a state as if the substrate 20 is floating in the treatment space, and a chemical, gas or the like is fed toward the front and back sides of the substrate 20 from nozzles, which are arranged on the dispenser units 13,14 and are located opposite the substrates 20, to perform cleaning of the substrate.

A description will firstly be made about the outer shell 2. The outer shell 2 is arranged to form within the inner shell 1 the treatment space which satisfies pressure-resistant sealing conditions for conducting cleaning. It is, therefore, preferred to construct the outer shell 2 such that the outer shell is selectively openable and hermetically closable and can withstand at least 2 atm. As the material making up the outer shell 2, it is desired to use a material capable of forming a high-pressure vessel, such as titanium or SUS. Because a chemical and/or gas is used under gas-tight conditions, the inner shell 2 may desirably be coated on at least an inner wall thereof with a fluorinated resin excellent in chemical resistance.

To permit placing the substrate in the treatment space of the inner shell 1 accommodated within the outer shell 2 and also taking it out of the treatment space, an upper section 3 of the outer shell 2 is constructed openable and closable. Further, to form the treatment space within the inner shell 1, it is necessary to establish sealing between the upper section 3 and a lower section 4. For this purpose, the outer shell 2 may preferably be provided, for example, with hydraulic, pneumatic or electromagnetic lifting devices 16 to selectively open and close the upper section 3 of the outer shell 2. These lifting devices 16 can selectively open and close the upper section 3 of the outer shell 2 and, when the upper section 3 is closed, can maintain the interior of the outer shell 2 in a sealed state. According to an investigation by the present inventors, this sealing of the interior of the outer shell 2 requires to hold the upper section 3 and the lower section 4 of the outer shell 2 in place under a pressure of at least 2 atm. In addition to the above-described mechanism for sealing the upper section 3 of the outer shell 2 concurrently with the closure of the upper section 3, it is also preferred, for example, to mechanically lock the upper and lower sections 3,4 together subsequent to the closure of the upper and lower sections 3,4 such that the upper section 3 is protected from failing to withstand a positive pressure and being raised upwards.

A description will next be made about the inner shell 1 accommodated within the outer shell 2. The inner shell 1 is provided with openings in upper and lower parts thereof, respectively, and also with outlets 9 for discharging waste water. On an inner wall of the inner shell 1, holding members 8 are arranged to hold within the treatment space the substrate 20 to be cleaned. Further, the inner shell 1 is constructed such that the inner shell 1 is rotatable about a vertical axis thereof while holding the substrate 20 by the holding members 8. The inner shell 1 constructed as described above serves to effectively perform cleaning owing to its rotation with the substrate 20 held thereon and also to protect the substrate 20 from a contaminated liquid to be discharged upon cleaning the substrate 20. As the inner shell 1 is brought into contact with high-concentration gas and/or a chemical employed for the cleaning, it is preferred to form the inner shell 1 with a fluorinated resin excellent in chemical resistance or to coat at least the interior of the inner shell 1 with such a fluorinated resin. Preferred embodiments can include the inner shell shown in FIGS. 3A, 3B and 4A and its modification illustrated in FIG. 4B. A description will hereinafter be made about the embodiment shown in FIGS. 3A, 3B and 4A and its modification illustrated in FIG. 4B.

Figure 3A:
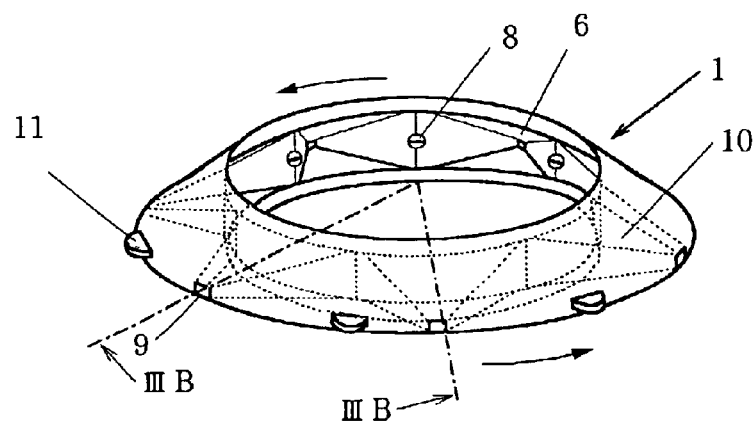
FIG. 3A is a schematic perspective view of an inner shell for use in the substrate cleaning apparatus according to the present invention.

The preferred embodiment of the inner shell 1 is depicted as the schematic perspective view in FIG. 3A. In the external appearance of the inner shell 1, the inner shell 1 is in the form of a truncated right cone internally having a treatment space and open at upper and lower ends thereof. On an outer peripheral wall of an upper section 6 of the inner shell 1, plural wheels 11 are arranged to rotate the inner shell 1 about the vertical axis thereof. In the embodiment shown in FIGS. 3A, 3B and 4A and its modification depicted in FIG. 4B, the wheels 11 are arranged at 6 locations on the outer peripheral wall of the inner shell 1. These wheels 11 are caused to run on and along a rail 5 (see FIGS. 1 and 2) arranged on the inner wall of the lower section 4 of the outer shell 2 so that the inner shell 1 is rotated about the vertical axis thereof. The wheels 11 can be rotated in any desired manner. For example, a motor can be arranged on the inner shell 1 and the wheels 11 themselves can be driven by using the motor as a source of their drive force. As an alternative, permanent magnets and electromagnets can be arranged on the inner shell 1 and in the rail 5, respectively, such that the inner shell 1 itself can be rotated by using he thus-constructed linear motor as a source of its drive force. In this connection, it is desired to design the inner shell 1 such that the rotation of the wheels 11 can be controlled at will within a range of from 0 to at least 3,000 rpm. As the inner shell 1 itself is constructed to rotate with the substrate held thereon in the present invention as described above, it is possible to effectively avoid the potential problem of the conventional apparatuses, in each of which cleaning is performed while spinning only a substrate, that by a sudden acceleration or deceleration, the substrate may be caused to spin in a position slid from holding members and may not be cleaned well.

As described above, the holding members 8 are arranged on the inner wall of the inner shell 1 to hold the substrate. It is preferred to arrange these holding members 8 such that, as illustrated in the cross-sectional view of FIG. 3B, the substrate 20 is held in a horizontal plane substantially centrally within a highly gas-tight treatment space formed surrounded by the inner wall of the inner shell 1 and the like. This makes it possible to effectively perform cleaning of the substrate and also to effectively prevent recontamination of the substrate with a contaminated liquid such as a chemical or water employed in the cleaning.

No particular limitations are imposed on the holding members 8 insofar as the substrate can be firmly held in a stable state within the treatment space. Usable examples of the holding members can include clamps capable of holding a peripheral edge portion of the substrate at both the upper and lower sides thereof (for example, see FIGS. 6A through 6D) or at both a vertical site of a peripheral edge of the substrate and the vertical site of the edge opposite to the former(for example, see FIGS. 6a and 6b) and mechanisms capable of holding the substrate at an peripheral edge thereof in a point-to-point contact manner so that a contact area of the substrate and the holding member 8 is 2 to 10 $mm^2$, preferably 4 to 7 $mm^2$. In the embodiment shown in FIGS. 3A, 3B and 4A and the modification depicted in FIG. 4B, insertion of a disk-shaped substrate into the treatment space within the inner shell 1 results in holding of the substrate at the peripheral edge portion thereof at equally spaced 6 points by the six holding members 8. As a consequence, the substrate is held in a horizontal plane within the treatment space.

Figure 5A:
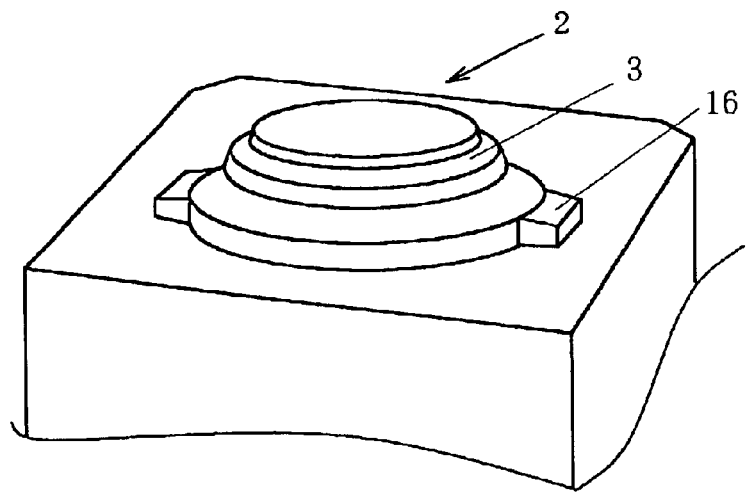
FIGS. 5A and 5B are simplified fragmentary perspective views of the substrate cleaning apparatus according to the present invention, illustrating how a substrate is automatically arranged in a treatment space of the apparatus.
Figure 5B:
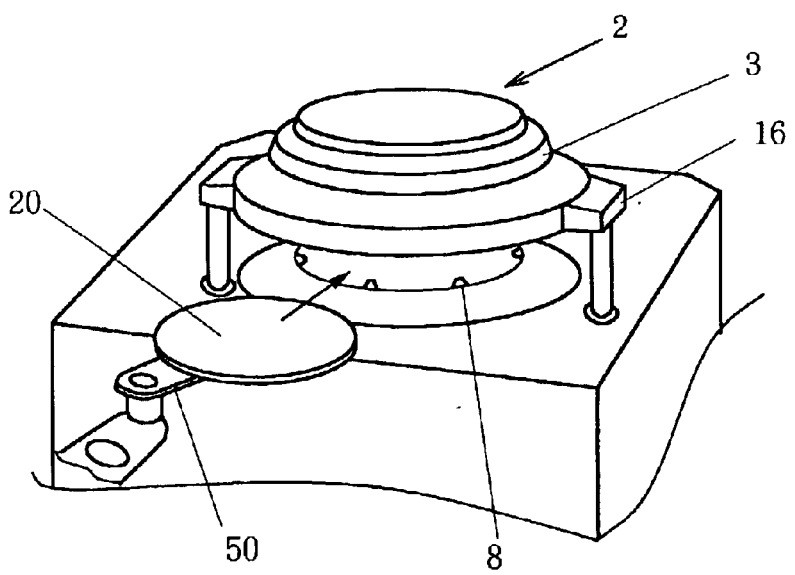

As mentioned above, the substrate to be cleaned may preferably be held stably in a horizontal plane substantially centrally within the treatment space. As illustrated in FIGS. 5A and 5B, upon using the apparatus according to the present invention, the substrate 20 is carried by a carrier robot 50 into a clearance defined between the upper section 3 of the outer shell 2 and the inner shell 1 as a result of raising of the upper section 3 by the lifting device 16, and subsequently, the substrate 20 is placed at a desired position in the inner shell 1. Here, no problem would arise insofar as the carrier robot 50 can, for example, suspend the wafer only at edges thereof by claws and carry it in the suspended state to the center of the treatment space. When a carrier robot such as that illustrated in FIG. 5B is used, a carrier arm may interfere with the substrate cleaning apparatus so that the substrate may not be smoothly placed within the treatment space. If this is proven to be the case, it is necessary to perform, for example, operation such that chuck mechanisms equipped with lifting function as shown in FIGS. 6A through 6D and FIGS. 6a and 6b are used, plural holding members are raised by the lifting function, and the holding members then receive the substrate in their raised positions and place it in the treatment space.

With reference to the schematic illustrations of FIGS. 6A through 6D, the operation of each chuck mechanism will be described. When the substrate 20 approaches the upper opening of the inner shell 1, an upper holding member 8a is firstly lifted, and the substrate 20 is supported on a claw portion arranged on an inner wall of the holding member 8a (see FIG. 6A). Next, the holding member 8a descends with the substrate 20 still supported on the claw portion, and at the same time, a lower holding member 8b ascends (see FIG. 6B). When the upper holding member 8a turns counterclockwise, the substrate is transferred onto the lower holding member 8b from the claw portion arranged on the inner wall of the upper holding member 8a (see FIG. 6C) Finally, a clamp portion of the upper holding member 8a descends onto the substrate 20 placed on the lower holding member 8b, and the substrate 20 is firmed held in place between the upper holding member 8a and the lower holding member 8b (see FIG. 6D) Further, arrangement of plural holding members 8 of the above-described mechanism makes it possible to hold a substrate stably in a horizontal plane substantially centrally within the treatment space.

The operation of a chuck mechanism shown in FIGS. 6a and 6b will also be described. The substrate 20 is hold at both a vertical site of an peripheral edge thereof and the vertical site of the edge opposite to the former. The holding is performed by clamping both the vertical sites of the substrate using two of the holding members 8c as shown in FIGS. 6a and 6b.

Figure 4A:
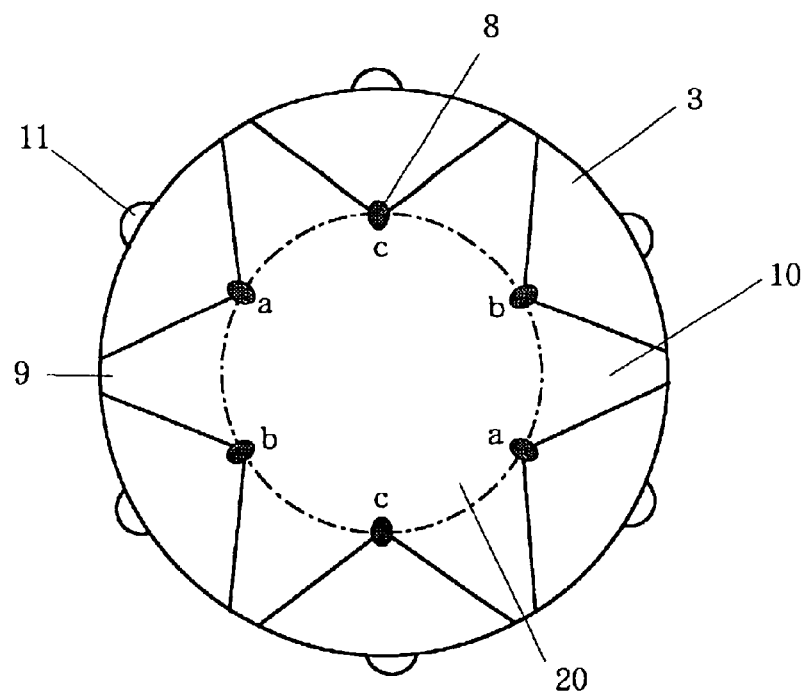
FIG. 4A is a simplified schematic illustration of channels in the inner shell of FIGS. 3A and 3B.
Figure 4B:
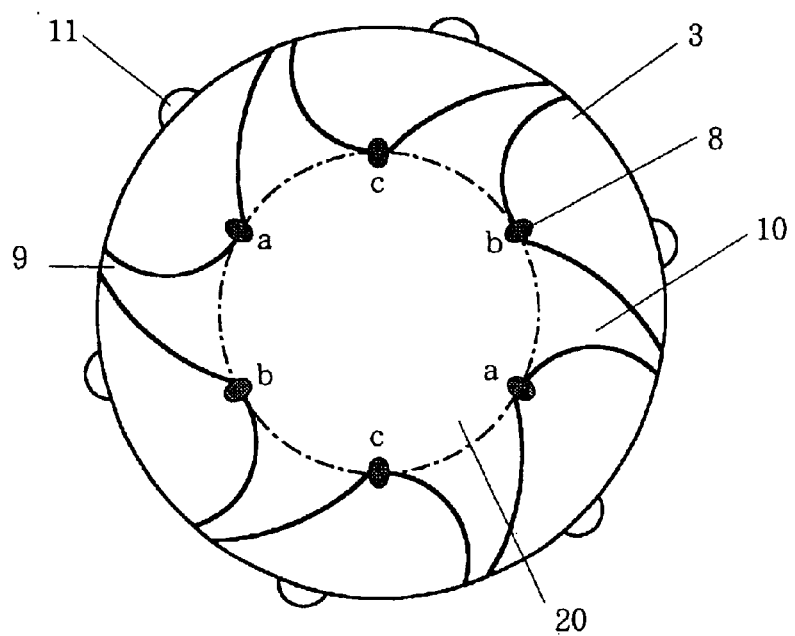
FIG. 4B is a simplified schematic illustration of a modification of the channels of FIG. 4A.

In addition, it is preferred to construct the above-described holding members 8, which are arranged at 6 locations, respectively, that as shown in FIGS. 4A and 4B, three pairs of diametrically opposite chuck mechanisms are each independently operable in a pair and these three pairs of diametrically opposite clamps can repeatedly hold and release the substrate in a successive order. As will be described subsequently herein, this construction makes it possible to solve the problem that the substrate 20 remains without being cleaned at areas where the substrate 20 is in contact with the holding members 8, so that the substrate 20 can be completely cleaned on both the front and back sides thereof.

In the case of the conventional holding method making use of a vacuum chuck mechanism which holds a substrate at the back side thereof under a vacuum, on the other hand, a holder covers the whole back side of the substrate. Therefore, the back side may become a contamination source, to say nothing of the problem that the substrate cannot be washed on the back side. In the case of a holder equipped with a conventional mechanical chuck mechanism to grip a substrate at only an end thereof, the substrate can be fixed stably insofar as the mechanical chuck mechanism contacts at a large area thereof with the substrate. However, the substrate cannot be cleaned at a gripped part so that the gripped part remains not cleaned. If the area of contact between the holder and the substrate is made very small in this case, the part which remains not cleaned can be made very small. In this case, however, the substrate tends to slip off from the holder and to rotate, for example, when rotation suddenly changes from high-speed rotation to low-speed rotation. Anew problem, therefore, arises in that a limitation is imposed on the manner of application of rotation and sufficient cleaning can be hardly performed. A holding method called "the Bernoulli chuck", which makes use of a stream of air, has difficulty in manufacturing a hermetically sealed apparatus, leading to a problem that a limitation is imposed on chemicals usable for treatment.

A description will hereinafter be made about the above-explained mechanism including the holding members 8 arranged at the six locations and permitting entirely cleaning a substrate, including its edge and back side, while establishing an area of contact sufficient to enable stable holding of the substrate. For example, the six holding members 8 can be arranged and constructed such that the holding members 8 oppose each other in three pairs across the center of the substrate as indicated by signs a–c, respectively, and the three pairs of the holding members 8 are each independently operable in a pair. This makes it possible, for example, to release the holding members 8 at the points a,a and to hold the substrate only at the remaining 4 points b,b,c,c. By successively changing the holding points of the substrate in this manner, the areas of the substrate at which the substrate are in contact with the holding members 8 can be successively exposed and cleaned. As a result, the front and back sides of the substrate can be cleaned over the entire areas thereof. According to an investigation by the present inventors, it has been found preferable to arrange these holding members at six locations or more on the inner wall of the inner shell 1 if one wants to hold a substrate stably and to cause it to spin in the thus-held state together with the inner shell 1. In such a case, it may be possible to perform cleaning of a substrate, for example, by holding the substrate at three points arranged at the vertices of an equilateral triangle and then changing the holding points to different three points arranged likewise. The investigation by the present inventors has, however, revealed that the above-described manner, in which three pairs of diametrically opposing holding members are each independently operated in a pair to always hold a substrate at four points, can hold the substrate stably and moreover, can completely perform cleaning of the areas of the substrate where the substrate is brought into contact with the holding members.

Figure 3B:
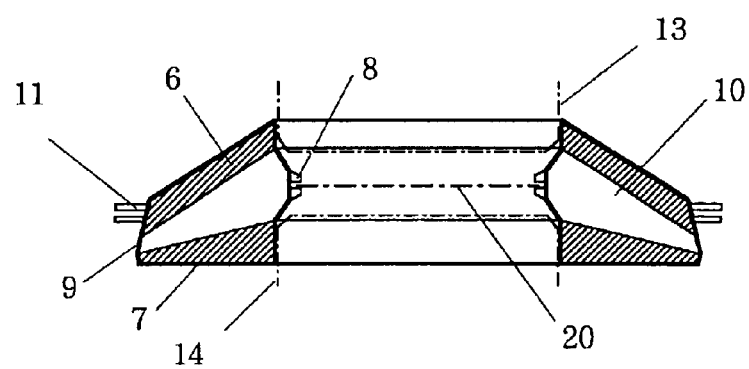
FIG. 3B is a vertical cross-sectional view of the inner shell of FIG. 3A as taken in the direction of arrows IIIB—IIIB of the same figure.

As illustrated in FIG. 1 and FIG. 2, the outlets 9 are arranged between the upper section 6 and a lower section 7 of the inner shell 1 to discharge waste liquids, such as a chemical and water, used in cleaning. No particular limitation is imposed on the number of these outlets 9. In the embodiment shown in FIGS. 3A, 3B and 4A and its modification depicted in FIG. 4B, these outlets 9 are arranged at six locations. To assure that the waste liquid is also discharged smoothly by free falling and the substrate is protected from recontamination with the waste liquid, it is preferred that as illustrated in FIG. 3B, the positions of the outlets 9 are set lower than the position at which the substrate is arranged, channels 10 are arranged extending to the outlets 9, respectively, and therefore, the channels 10 are inclined downwardly toward the corresponding outlets 9. No particular limitation is imposed in shape on the channels 10. For example, the channels 10 can be linear as shown in FIG. 4A or can be curved in the direction of rotation of the inner shell 1 as illustrated in FIG. 4B. When the inner shell 1 is rotated, the formation of the channels 10 as described above makes it possible to effectively prevent the waste liquid from splashing back onto the substrate and hence to lessen the potential problem of recontamination of the substrate, thereby permitting efficient discharge of fluids such as waste liquid and gas.

As illustrated in FIG. 1 and FIG. 2, the paired upper and lower dispenser units 13,14 are inserted in the upper and lower openings of the inner shell 1 constructed as described above. As a consequence, a highly gas-tight treatment space is formed by the inner wall of the inner shell 1 and the inner end portions of the dispenser units 13,14. The dispenser units 13,14 are each provided on the inner side thereof with a flat area having at least one nozzle. When the substrate 20 is arranged within the inner shell 1, these flat areas extend substantially in parallel with the substrate. Further, the dispenser units 13,14 are accommodated within the outer shell 2 which allows the formation of the treatment space within the inner shell 1 such that the treatment space meets predetermined pressure-resistant sealing conditions (see FIG. 1 and FIG. 2), and the dispenser units 13,14 are constructed such that the sealing of the treatment space is not disturbed by vertical movements of the dispenser units. As a means for vertically moving the dispenser units, an appropriate conventional means such as one making use of a motor as a drive source can be chosen and used. To permit efficient performance of cleaning no matter how the cleaning is conducted, it is preferred to arrange a means for precisely controlling vertical movements of the dispenser units such that the distances between the flat areas on the inner end portions of the dispenser units and the corresponding sides of the substrate can be accurately adjusted as desired.

Figure 7:
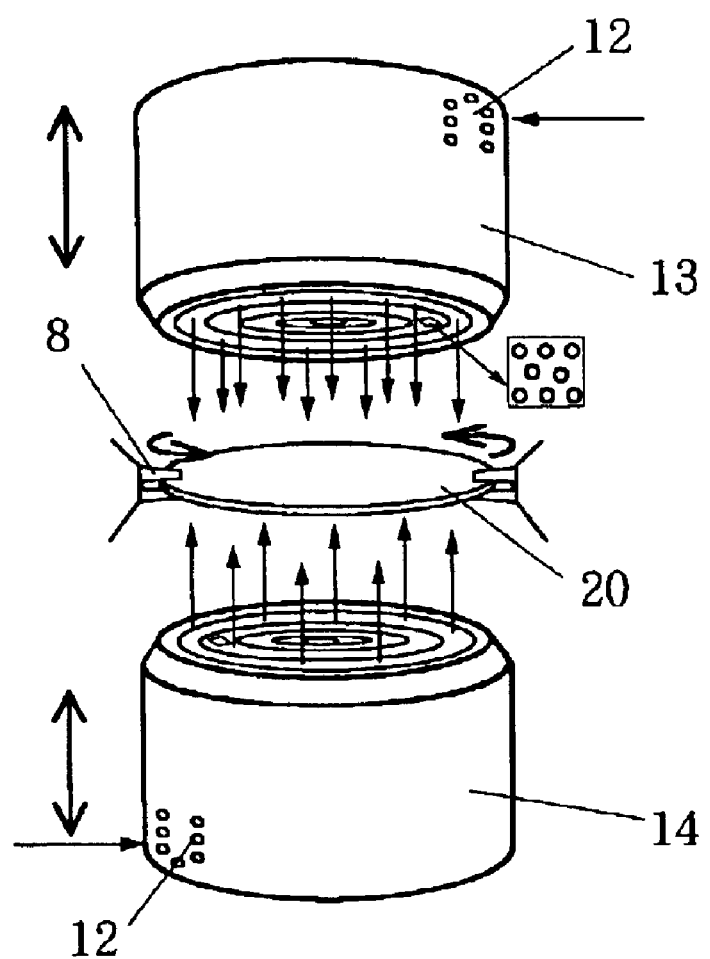
FIG. 7 is a schematic illustration showing how a substrate is cleaned by the substrate cleaning apparatus according to the present invention.

When the substrate is arranged, the flat areas on the end portions of the paired upper and lower dispenser units are located opposite the front and back sides of the substrate, respectively. These dispenser units are constructed such that a liquid or gas can be fed from the at least one nozzle arranged at each of the flat areas (see the schematic view of FIG. 7). It is preferred to arrange a sensor at the flat area on the inner end portion of each dispenser unit to measure the distance from the substrate. It is also desired to construct these dispenser units such that in positioning these dispenser units, the dispenser units can be feedback controlled using information from the sensors. Feeding of a liquid or gas to the dispenser units is effected through the supply ports 12 shown in FIG. 2 and FIG. 7 while maintaining the treatment space in a highly gas-tight state.

Figure 8A:
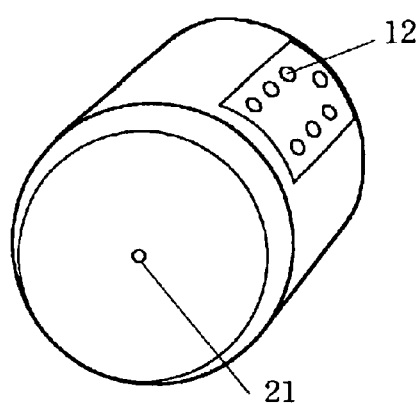
FIG. 8A is a perspective view of an example of each dispenser unit for use in the substrate cleaning apparatus according to the present invention.
Figure 8B:
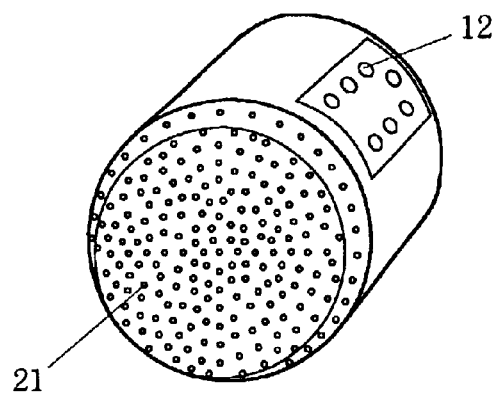
FIG. 8B is similar to FIG. 8A but illustrates a modification of the dispenser unit.
Figure 9A:
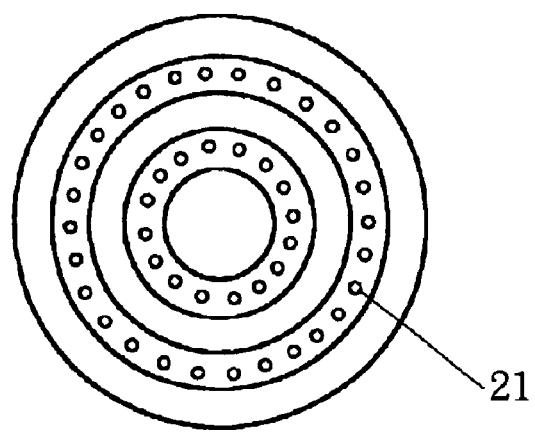
FIG. 9A is a schematic illustration of a nozzle face according to another modification of the dispenser unit.
Figure 9B:
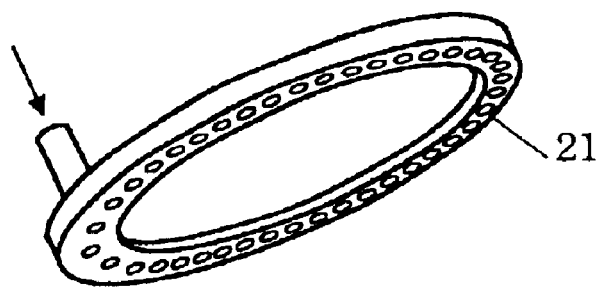
FIG. 9B is a schematic perspective view showing one of annular ring members for use in a form assembled in the another modification.
Figure 10A:
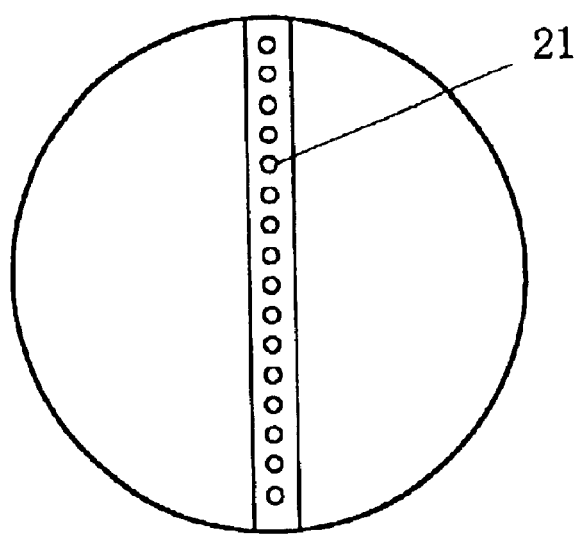
FIG. 10A is a schematic illustration of a nozzle face according to a further modification of the dispenser unit.
Figure 10B:
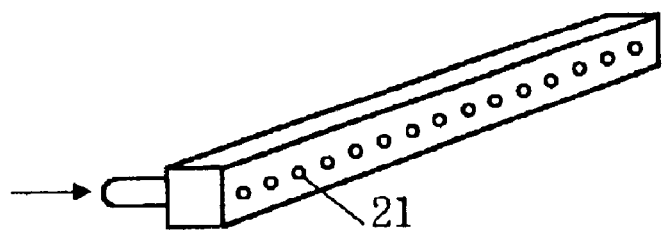
FIG. 10B is a schematic perspective view showing a linear ring member for use in a form assembled in the further modification.

As described above, each dispenser unit is provided with at least one nozzle at the flat area on the inner end portion thereof. No limitation is imposed on the number and location (s) of such nozzle(s). As illustrated by way of example in FIG. 8A, one nozzle 21 may be arranged around the center of the flat area. As shown in FIG. 8B, on the other hand, a plurality of nozzles 21 may be arranged over the entire surface of the flat area. As also depicted in FIGS. 9A and 9B, a plurality of nozzles 21 may be arranged concentrically at each angular intervals. A still further alternative example is shown in FIGS. 10A and 10B, in which a plurality of nozzles 21 are arrayed linearly at equal intervals. These nozzles 21 are constructed to permit feeding of a gas and/or a liquid, such as a cleaning solution or rinse water, from them. With the apparatus according to the present invention, cleaning of various substrates can be performed by suitably choosing gas (es) and liquid(s) to be fed from these nozzles.

For example, arrangement of plural nozzles 21 at appropriate locations on the flat area of each dispenser unit makes it possible to feed a liquid to the entire surfaces of a substrate without relying upon flows of the liquid, said flows requiring to spin the substrate. As an alternative example, arrangement of plural sets of nozzles 21, which are arranged concentrically at equal angular intervals as illustrated in FIG. 9A, at different locations on the flat area makes it possible to separately feed gas (es), cleaning solution(s), rinse water and the like from the different locations. This can provide the apparatus according to the present invention with additional functions such as bringing a gas and a liquid, which have been fed separately from the nozzles at different locations, separately into contact with a substrate or mixing them together before they reach the substrate, so that the apparatus can perform a variety of treatments. To realize this, nozzle units of such a construction as illustrated in FIG. 9B or 10B, for example, can be incorporated in each of the dispenser units.

Figure 11:
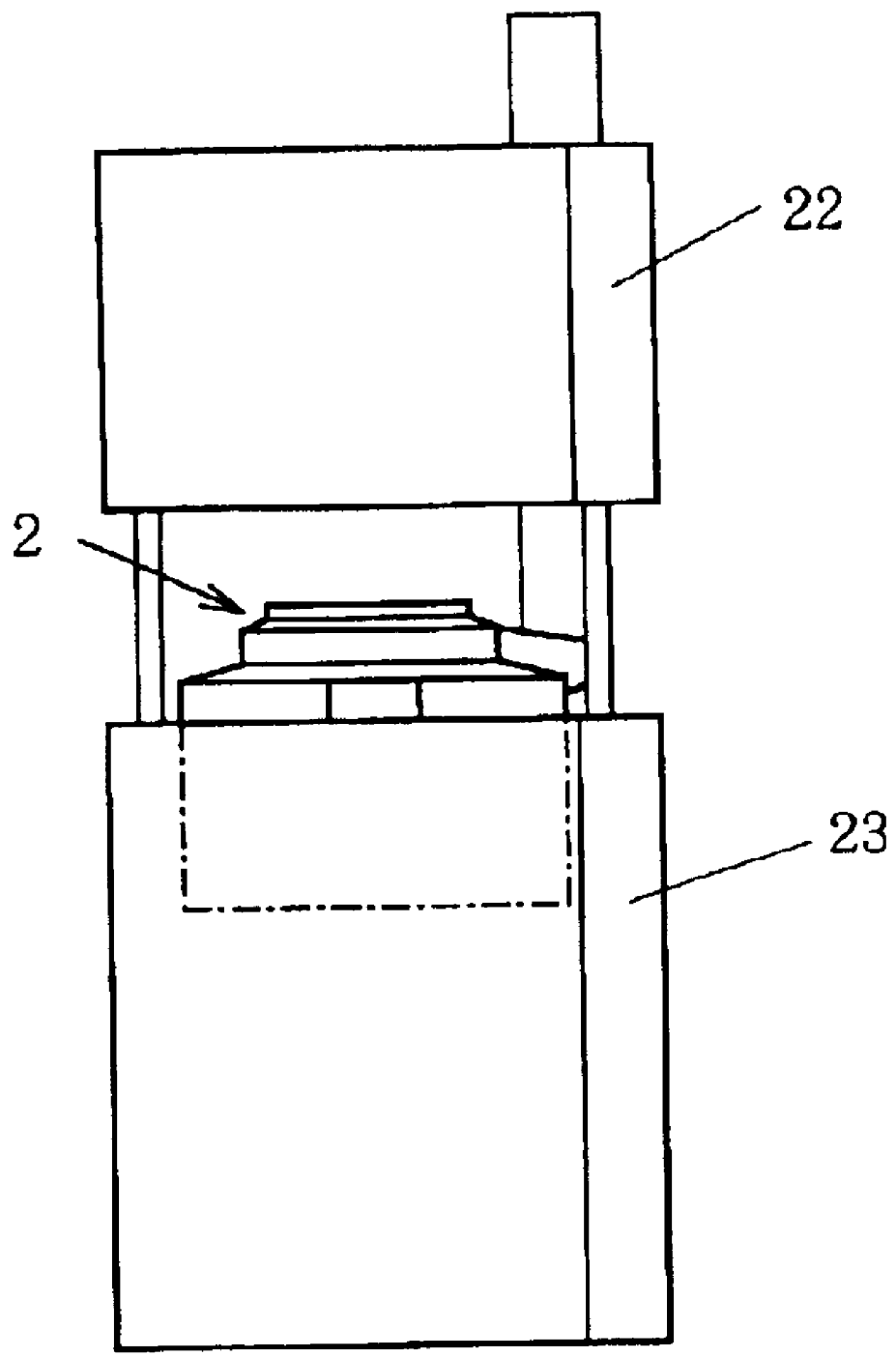
FIG. 11 is a simplified front elevation of a substrate cleaning system with the apparatus according to the present invention incorporated therein.

A description will next be described about a manner of use of the apparatus according to the present invention having the above-described construction. As illustrated by way of example in FIG. 11, a treatment unit (hereinafter called "the chamber") which is composed primarily of the above-described outer shell, inner shell and dispenser units is arranged centrally, a gas and liquid transportation/process performing unit 23 is arranged underneath the treatment unit, and an electric control unit 22 is arranged above the treatment unit. This arrangement can reduce the floor area required for the installation of a substrate cleaning system and moreover, is desired from the standpoint of safety.

Upon cleaning a substrate, the substrate is firstly arranged in the inner shell 1 in accordance with the above-described procedure, and the internal atmosphere of the chamber is controlled to meet an atmosphere condition required for a desired treatment. The atmosphere condition for the interior of the chamber can be either a chemical atmosphere or a gas-flowing atmosphere developed as a result of an off-balance in pressure by evacuation. According to the apparatus of the present invention, the former atmosphere can be established by sealing the interior of the chamber and feeding desired gas or gases, while the latter atmosphere can be established by adjusting the openings of a waste water/solution drain valve 18 and an exhaust on/off valve 19 (hereinafter simply called "the valves 18,19"), both of which serve to establish or cut off connection between an exhaust pipe 17 and the chamber (see FIG. 2), or by adjusting the degree of opening of the upper section 3 itself of the outer shell 2.

With reference to FIG. 2, a description will be made about a manner of control of atmosphere conditions within the chamber. Upon arranging the substrate 20 in the inner shell 1, the chamber is filled with air. Subsequent to the arrangement of the substrate 20 in the inner shell 1, the valves 18,19 are firstly kept open, and a desired gas is introduced into the chamber from the dispenser units 13,14 to replace the air in the chamber with the desired gas. After completion of this replacement, the valves 18,19 are closed to bring the chamber into a sealed state, and the feeding of the gas is continued until a predetermined internal pressure is reached. Cleaning of a substrate is conducted by bringing the chamber into such a sealed system for the following reasons: (1) to establish a desired chemical atmosphere, which is required for the cleaning, by using a gas in a small amount, (2) to increase the amount of a gas, which is to be dissolved in a cleaning solution, by raising the pressure of the gas, (3) to realize cleaning without being affected by fluctuations in the feed pressure of a gas, and (4) to avoid leakage of a dangerous gas to the outside of the chamber.

When stripping off a resist film formed on a surface of a substrate, for example, the resist film is treated with ozone/warm water, followed by the cleaning with ammonia/oxygen/warm water. Taking this stripping as an example, a description will be made specifically. Firstly, the substrate 20 is arranged in the inner shell 1, and the air in the chamber is replaced with ozone gas. The valves 18,19 are then closed to fill the chamber with ozone gas. After conducting ozone gas/warm water treatment under sealed conditions, the valves 18,19 are opened while rinsing the substrate 20 and charging nitrogen gas, so that ozone gas and waste water are discharged from the chamber. After the interior of the chamber is again placed under sealed conditions, ammonia and oxygen gas are charged until a predetermined pressure is reached, and warm water treatment is then conducted. By this procedure, the gas atmosphere is adjusted. In the above-described case, the amount of each gas dissolved in warm water is determined by the partial pressure of the gas upon its contact with the warm water, so that it is desired to maintain the internal pressure of the chamber at 1 atm or higher. No particular limitation is imposed on a means for feeding a gas or liquid to the nozzles in the above procedure. This feeding can be achieved, for example, by arranging feed lines such that a gas, a cleaning solution and rinse water can be selectively caused to merge feed lines to the supply ports 12 of the dispenser units 13,14 via air operated valves or the like, and then by selectively opening one or more of the air operated valves or the like as needed.

Figure 12:
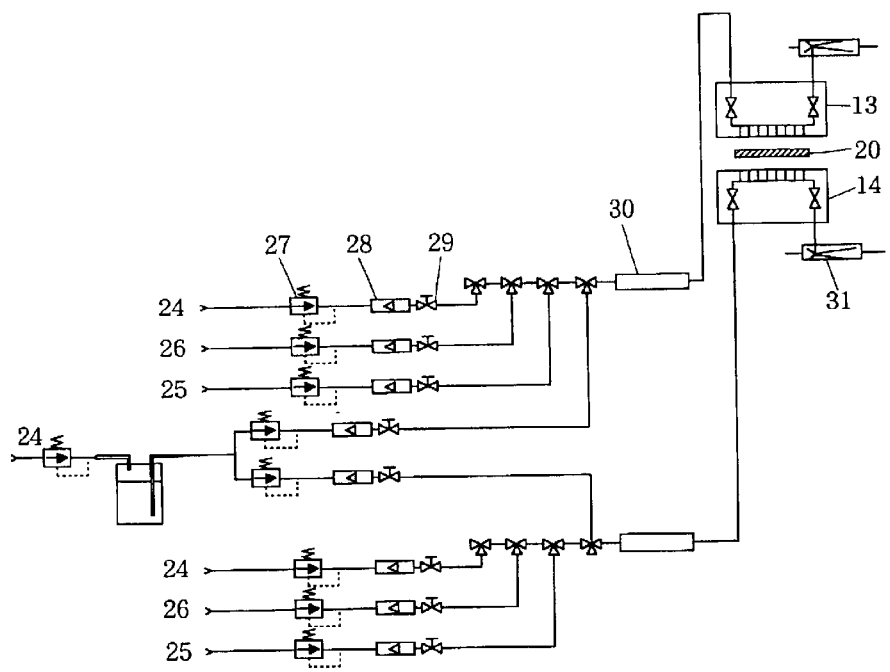
FIG. 12 is a flow diagram showing illustrative feeding of gases and liquids to the apparatus according to the present invention.

Referring to FIG. 12, a description will be made about the feeding of gas and/or liquid in the apparatus according to the present invention. In the diagram, numeral 24 indicates lines for feeding nitrogen gas to be employed for diluting or carrying reactive gases, numeral 25 designates lines for feeding reactive gases such as ozone and ammonia, and numeral 26 shows lines for feeding pure water to be used for cleaning or rinsing. The diagram also shows pressure control valves 27, flowmeters 28, flow control valves 29, static mixers 30 for mixing gas(es) and/or liquid(s) to be fed, and aspirators 31. These lines and devices are arranged as illustrated in FIG. 12, gas(es) and/or liquid(s) are suitably chosen to conform with the objective of each treatment, and open/closure conditions for the pressure control valves 27 and flow control valves 29 and operating conditions for the static mixers 30 and aspirators 31 are appropriately controlled to meet predetermined conditions for the treatment. As a result, the kind(s) and amount(s) of gas(es) and/or liquid(s) to be fed toward the substrate 20 from the dispenser units 13,14 can be controlled as desired.

Figure 13:
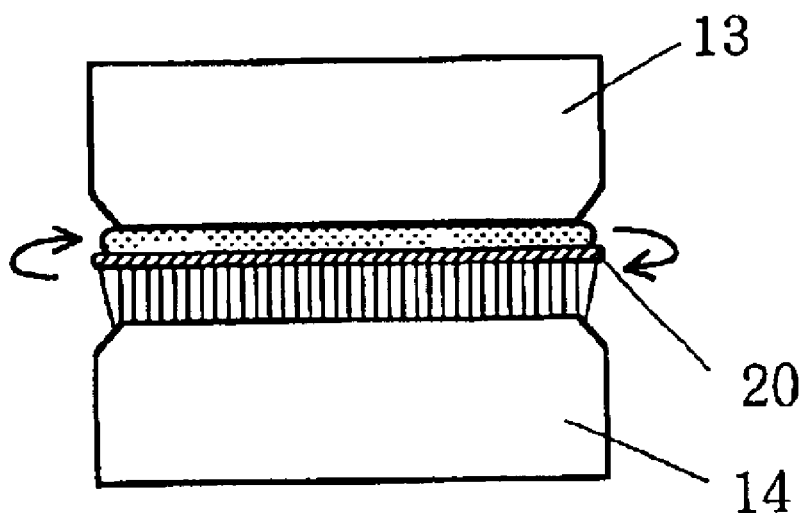
FIG. 13 is a schematic illustration of a substrate and dispenser units under cleaning by the apparatus according to the present invention.
Figure 14A:
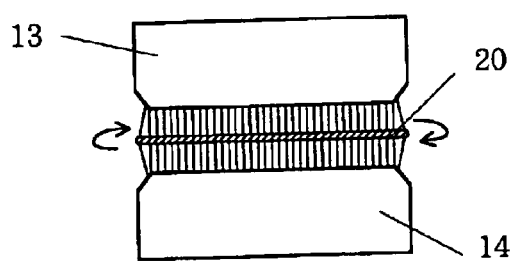
FIGS. 14A through 14E are a series of schematic illustrations of a substrate and the dispenser units while the substrate is being cleaned by the apparatus according to the present invention under conditions different from those employed in FIG. 13.
Figure 14B:
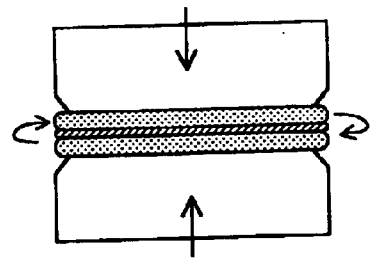
Figure 14C:
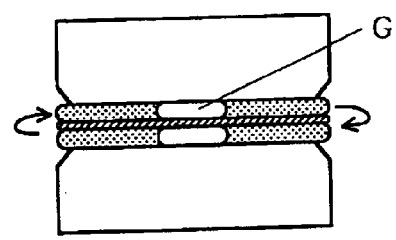
Figure 14D:
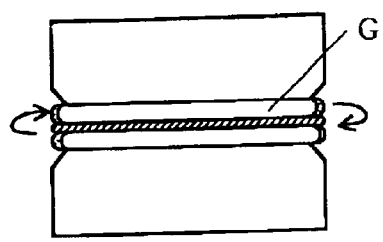
Figure 14E:
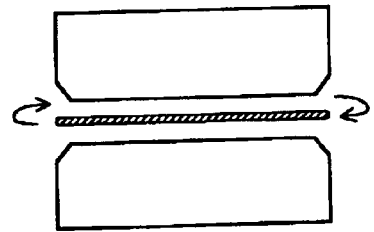

A description will next be made about various manners for feeding a gas or a liquid, such as a cleaning solution or rinse water, from the nozzles 21 arranged at the flat areas (hereinafter simply called "the flat areas") on the inner end portions of the dispenser units 13,14 (hereinafter simply called "the flat areas"). As already explained, the apparatus of the present invention enables cleaning in various manners by changing the number and position(s) of the nozzle(s) 21 on each dispenser unit and/or the distances between a substrate and the above-described flat areas. Reference is firstly had to FIG. 13 When each flat area is moved closer to the substrate until a certain clearance is left therebetween, the clearance between the substrate and the flat area can be filled with a film of liquid by making use of the surface tension of water. According to an investigation by the present inventors, it has been found that for the realization of this state, the flat area has to be brought to a distance of 3 mm or less from the corresponding side of the substrate without causing any contact therebetween. For the formation of such a liquid film, it is hence needed to accurately control the interval between the flat area and its corresponding side of the substrate to 3 mm or smaller. Further, in order to stably maintain a liquid film formed under the above-described conditions, it is important to place in a horizontal plane the substrate. For the realization of this requirement, it is, therefore, necessary to horizontally arrange the inner shell, on which the substrate is to be held, and also the outer shell which supports the inner shell by the rail.

Reference will next be had to FIGS. 14A through 14E. The nozzles on the dispenser units 13,14 are brought close to the corresponding sides of the substrate while spinning the substrate and feeding water through the nozzles, and a gas is fed with the clearances between the substrate 20 and the respective flat areas being filled with water (see FIGS. 14A through 14C). This makes it possible to cause gas bubbles G to run on and along the substrate (see FIGS. 14C and 14D). When the feeding of water is stopped. Now assume that, while the liquid films are maintained, the feeding of water is stopped and a gas such as ammonia gas is fed under low-speed rotation. This makes it possible to bring the gas at high concentration and also water into contact with the substrate at a very low flow rate of the gas without needing filling the outer shell with the gas to a high pressure. Even in this case, it is desired for the sake of safety to maintain the outer shell in a sealing state to prevent the gas from leaking to the outside. When the above-described manner is applied to treatment with a chemical, the clearances between the flat areas and the corresponding sides of the substrate can be filled with the chemical to form liquid films there without discharging the chemical as an effluent, and the chemical can be maintained evenly in this state for a long time. It is, therefore, possible to substantially reduce the amount of the chemical to be used.

According to the apparatus of this invention, drying of a substrate subsequent to its treatment with the chemical can be surely performed without recontamination of the substrate. As a problem commonly observed in a drying step in conventional substrate cleaning apparatuses, recontamination of a substrate may take place in the post-treatment drying step when water droplets still remain on the wall of the chamber even after the substrate has been dried or when a gas inside the chamber contains mist abundantly. In the apparatus of the present invention, on the other hand, the chamber is of the double shell structure formed of the outer shell and the inner shell accommodated within the outer shell, the substrate is surrounded by the inner wall of the inner shell and the inner end portions of the dispenser units, and the inner shell and dispenser units are surrounded by the outer shell which can be hermetically closed. The treatment space is, therefore, in a state isolated from the remaining parts or sections. Compared with treatment of a substrate mounted on a spin table in an exposed treatment space within a chamber of a conventional apparatus not equipped with a double shell or wall structure, the apparatus of the present invention can also bring about a pronounced advantageous effect for the inhibition of recontamination of the substrate in the above-described drying step.

According to an investigation by the present inventors on the problem of recontamination of a substrate in a drying step, no liquid was observed to remain on the substrate or in the treatment space in the case of the apparatus of the present invention when an experiment was conducted by rinsing the substrate to make it wet and then spinning it at 3,000 rpm for 30 seconds. With a conventional apparatus, on the other hand, water droplets were observed remaining on a wall of a chamber. It has, therefore, been found that in a drying step, a substrate may be recontaminated with these water droplets.

As a potential problem specific to the apparatus of the present invention, arrangement of many nozzles at the flat area of each dispenser unit may result in penetration of a liquid into the nozzles during cleaning, and depending on the diameter of the nozzles, the liquid may drip off in a drying step or the like so that recontamination of the substrate may not be completely avoided. If the liquid remaining in the dispenser units is concerned in the drying step or the like, the potential problem can be resolved by drawing, before entering the drying step, the liquid out of the dispenser units through the aspirators 31 (see FIG. 12) to avoid dripping of the liquid.

Another potential problem may arise when the apparatus of the present invention is used to wash the back side of a substrate. In this application, the substrate is conveyed to the apparatus with the back side thereof in a contaminated state. When a carrier robot constructed as shown in FIG. 5B is employed, recontamination may take place if the cleaned substrate is carried out by the robot. For this application, it is desired to arrange different robots, one being for arranging a substrate and the other for taking it out subsequent to cleaning, or to wash substrate-holding portions of a carrier robot subsequent to the arrangement of the substrate.

The present invention will hereinafter be described in detail based on an Example.

EXAMPLE 1

A CVD (chemical vapor deposition) process may include such a step that subsequent to formation of a Ti film on a substrate, a W film is formed successively. In a subsequent cleaning step, it may be desired, in some instances, to eliminate adhered Ti or W contaminant from the edge and back side of the substrate without dissolving the surface W film or the Ti film lying under the W film. In this Example, the apparatus of the present invention was applied to the cleaning step. For use in the cleaning, an 8-inch silicon substrate with 10-nm thick thermal oxidation $SiO_2$ films formed on both sides thereof was fabricated and provided. The substrate was subjected to etching such that the substrate was selectively etched on only the back side and edge thereof. The substrate cleaning apparatus had the construction described above with reference to FIGS. 1 through 4A, and was provided at six locations with holding members constructed as illustrated in FIG. 6.

Figure 15A:
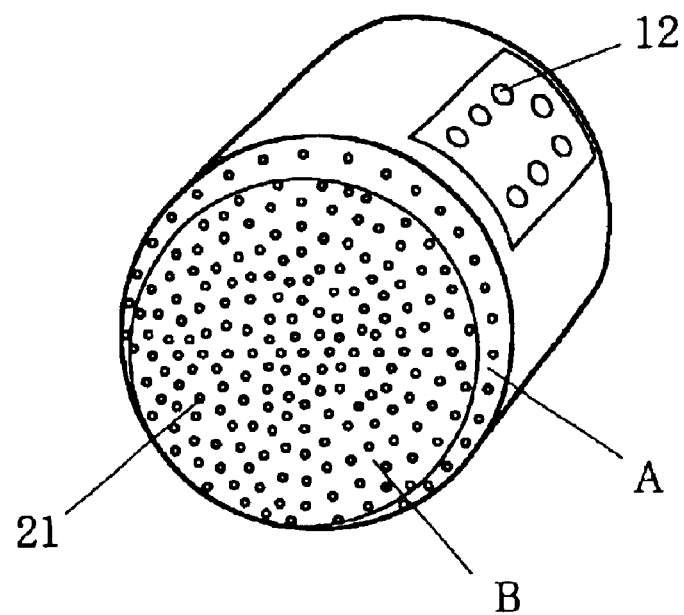
FIG. 15A is a perspective view of one of dispenser units in the substrate cleaning apparatus according to the present invention employed in an Example.
Figure 15B:
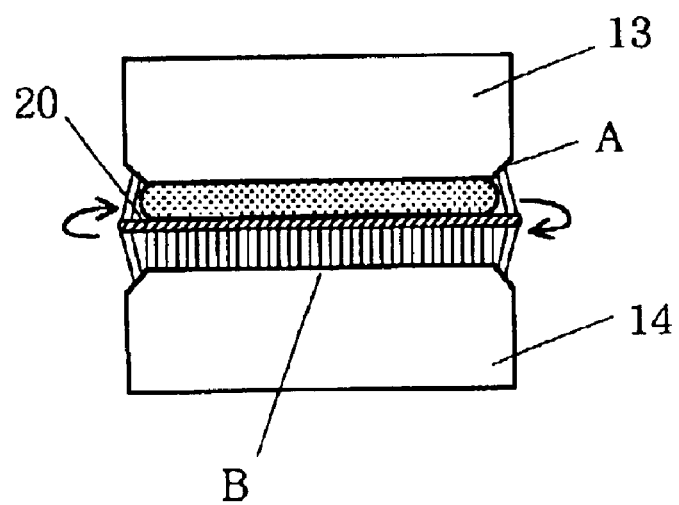
FIG. 15B is a schematic illustration of a substrate and the dispenser units under cleaning in the Example.

The substrate was placed in the inner shell 1 with the side, on which the W film was exposed, facing up and the side, on which the thermal oxidation $SiO_2$ film was exposed, facing down. Firstly, the dispenser units 13,14 were moved to set their distances from the front and rear sides at 3 cm, respectively. While rotating the inner shell such that the substrate was spun at 10 rpm, the substrate was rinsed for 10 seconds to make the substrate wet evenly on all the surfaces thereof. The rinsing was conducted by feeding pure water at a rate of 1 L/min from the upper and lower dispenser units, respectively. After the flow rate of the rinse water was then changed to 200 mL/min, the upper dispenser unit 13 was brought closer to a distance of 3 mm from the upper side of the substrate. Fifteen (15) seconds later, a liquid film was formed between the upper side of the substrate and the flat area as shown in FIG. 13. When the liquid film became stable, a 0.5% hydrogen fluoride (HF) solution was fed from the dispenser units 13,14. During that feeding of the HF solution, the feeding of the HF solution from the upper dispenser unit 13 was conducted at a flow rate of 100 mL/min from only an area A illustrated in FIG. 15A while the feeding of the HF solution from the lower dispenser unit 14 was effected at room temperature and a flow rate of 500 mL/min from both areas A,B shown in FIG. 15A. The substrate was treated for 1 minute. After the dispenser unit 13 was next lifted to a position 3 cm apart from the upper side of the substrate, the substrate was rinsed with pure water and then dried to complete the cleaning.

The results of the cleaning are summarized in Table 1. Between the edge and back side to which the HF solution was applied and the front side protected with the water film, the application and non-application of the treatment with the HF solution were recognized as pronounced differences in etched depth.

TABLE 1

Etched depths at respective locations

| Treated location | | Etched depth (nm) |
|---|---|---|
| Front side protected by water film | | 0 |
| HF-applied substrate location | Edge | 2.7 |
| | Back side | 3.0 |

This application claims the priority of Japanese Patent Application 2000-165644 filed May 31, 2001, which is incorporated herein by reference.

What is claimed is:

1. A substrate cleaning apparatus comprising:
    an outer shell constructed such that said outer shell is selectively openable or hermetically closable,
    an inner shell enclosed within said outer shell and having an upper and lower openings and an outlet for discharging effluent, and
    an upper and lower dispenser units arranged for vertical movements such that said upper and lower dispenser units can be inserted into or removed from said upper and lower openings, respectively, said dispenser units being provided on inner end portions thereof with flat areas each of which has at least one nozzle, and, when said upper and lower dispenser units are inserted into said upper and lower openings of said inner shell, respectively, a highly gas-tight space is formed by said inner end portions and an inner wall of said inner shell,
    wherein said inner shell is provided through said inner wall thereof with an outlet for discharging at least one of waste gas and waste liquid and is also provided on said inner wall thereof with a holding member for holding a substrate, which is under cleaning, out of contact with said end portions of said dispenser units, and said inner shell is constructed for rotation about a vertical axis thereof with said substrate held by said holding member.

2. A substrate cleaning apparatus according to claim 1, wherein said holding member comprises six clamps for holding a peripheral edge portion of said substrate at an upper and lower sides thereof, said clamps are arranged at equal angular intervals therebetween at such locations that, when said substrate is inserted into said highly gas-tight space, said substrate can be held at said peripheral edge portion thereof by said clamps arranged as three pairs of diametrically opposite clamps, and said three pairs of diametrically opposite clamps are each independently operable in a pair such that said three pairs of diametrically opposite clamps can repeatedly hold and release said substrate in a successive order.

3. A substrate cleaning apparatus according to claim 1, wherein said holding member has a mechanism to hold said substrate at an edge hereof in a point-to-point contact manner such that said substrate held by said mechanism is arranged substantially in parallel with said flat areas on said inner end portions of said dispenser units.

4. A substrate cleaning apparatus according to claim 1, wherein from said at least one nozzle arranged at said flat area of each of said dispenser units, at least one of gas and liquid is fed into said highly gas-tight space.

5. A substrate cleaning apparatus according to claim 1, further comprising a system for evacuating said outer shell and a system for evacuating said inner shell.

6. A substrate cleaning apparatus according to claim 1, further comprising at least one rinsing nozzle for cleaning an interior of at least one of said outer shell and inner shell.

7. A substrate cleaning apparatus according to claim 1, wherein said substrate is selected from the group consisting of a silicon wafer, a metal compound wafer, a glass plate, a quartz plate and a metal plate.

* * * * *